United States Patent
Cho et al.

(10) Patent No.: US 8,558,476 B2
(45) Date of Patent: *Oct. 15, 2013

(54) BACKLIGHT UNIT

(75) Inventors: Won Cho, Ansan-si (KR); Bi-Yong Jeong, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/464,566

(22) Filed: May 4, 2012

(65) Prior Publication Data

US 2012/0217886 A1 Aug. 30, 2012

Related U.S. Application Data

(63) Continuation of application No. 12/415,381, filed on Mar. 31, 2009, now Pat. No. 8,193,721.

(30) Foreign Application Priority Data

Mar. 31, 2008 (KR) ........................ 10-2008-0030045

(51) Int. Cl.
*H05B 41/16* (2006.01)
(52) U.S. Cl.
USPC ........................ 315/251; 315/185 R; 315/294
(58) Field of Classification Search
USPC ..................... 315/185 R, 246, 251, 291, 294; 313/496, 501–504, 512; 345/102
See application file for complete search history.

(56) References Cited

U.S. PATENT DOCUMENTS

| | | | |
|---|---|---|---|
| 6,577,073 B2 | 6/2003 | Shimizu et al. | |
| 6,909,234 B2 | 6/2005 | Chen | |
| 7,005,679 B2 | 2/2006 | Tarsa et al. | |
| 7,586,127 B2 * | 9/2009 | Nomura et al. | 257/89 |
| 7,679,281 B2 * | 3/2010 | Kim et al. | 313/501 |
| 8,071,988 B2 * | 12/2011 | Lee et al. | 257/88 |
| 2004/0000867 A1 | 1/2004 | Chen | |
| 2004/0080941 A1 * | 4/2004 | Jiang et al. | 362/252 |
| 2006/0038542 A1 * | 2/2006 | Park et al. | 323/229 |
| 2008/0024070 A1 | 1/2008 | Catalano et al. | |
| 2008/0048193 A1 * | 2/2008 | Yoo et al. | 257/89 |
| 2008/0088769 A1 * | 4/2008 | Kim et al. | 349/61 |

(Continued)

OTHER PUBLICATIONS

Non-Final Office Action of U.S. Appl. No. 12/415,381 dated Jul. 18, 2011.

(Continued)

*Primary Examiner* — Tung X Le
(74) *Attorney, Agent, or Firm* — H.C. Park & Associates, PLC

(57) ABSTRACT

The present invention relates to a backlight unit that includes at least one first light emitting diode (LED) package and at least one second LED package, wherein the first LED package includes a blue LED chip, a green LED chip, and a first phosphor, the first phosphor being excited by blue light and to emit light to be mixed with blue light and green light respectively emitted from the blue LED chip and the green LED chip, the first LED package to thereby emit white light. The second LED package includes a blue LED chip, a red LED chip, and a second phosphor, the second phosphor being excited by blue light and to emit light to be mixed with blue light and red light respectively emitted from the blue LED chip and the red LED chip, the second LED package to thereby emit white light.

14 Claims, 4 Drawing Sheets

(56) References Cited

U.S. PATENT DOCUMENTS

2008/0144334 A1\* 6/2008 Shin et al. ..................... 362/612
2009/0322250 A1 12/2009 Zulim et al.
2010/0213821 A1 8/2010 Masuda et al.

OTHER PUBLICATIONS

Final Office Action of U.S. Appl. No. 12/415,381 dated Dec. 8, 2011.
Notice of Allowance of U.S. Appl. No. 12/415,381 dated Feb. 9, 2012.

\* cited by examiner

BACKLIGHT UNIT

CROSS-REFERENCE TO RELATED APPLICATIONS

This application is a continuation of U.S. application Ser. No. 12/415,381, filed on Mar. 31, 2009, and claims priority from and the benefit of Korean Patent Application No. 10-2008-0030045, filed on Mar. 31, 2008, which are hereby incorporated by reference for all purposes as if fully set forth herein.

BACKGROUND OF THE INVENTION

1. Field of the Invention

The present invention relates to a backlight unit for providing a white light source in a liquid crystal display.

2. Discussion of the Background

A liquid crystal display (LCD) typically includes an LCD panel having a thin film transistor (TFT) array substrate and a color filter substrate, which are opposite from and bonded to each other. The TFT array substrate and the color filter substrate are spaced apart from each other by a predetermined distance, and a liquid crystal layer is disposed in the space between the substrates. The LCD also includes a driver for driving the LCD panel, and a backlight unit for supplying backlight to the LCD panel.

A conventional backlight unit emits white light that may be generated by a red-green-blue (RGB) full-color light emitting diode (LED) package or by a mixture of lights emitted from respective red, green, and blue LEDs. However, when the backlight unit is implemented using an RGB full-color LED package or respective LED chips, there may be an unwanted increase in manufacturing costs and decrease in yield.

SUMMARY OF THE INVENTION

The present invention relates to a backlight unit including at least first and second light emitting diode packages.

Additional features of the invention will be set forth in the description which follows, and in part will be apparent from the description, or may be learned by practice of the invention.

The present invention discloses a backlight unit that includes at least one first LED package and at least one second LED package, wherein the first LED package includes a blue LED chip, a green LED chip, and a first phosphor, the first phosphor being excited by blue light and to emit light to be mixed with blue light and the green light respectively emitted from the blue LED chip and the green LED chip, the first LED package to thereby emit white light; the second LED package includes a blue LED chip, a red LED chip, and a second phosphor, the second phosphor being excited by blue light and to emit light to be mixed with blue light and red light respectively emitted from the blue LED chip and the red LED chip, the second LED package to thereby emit white light; and the first LED package and the second LED package are alternately arranged.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
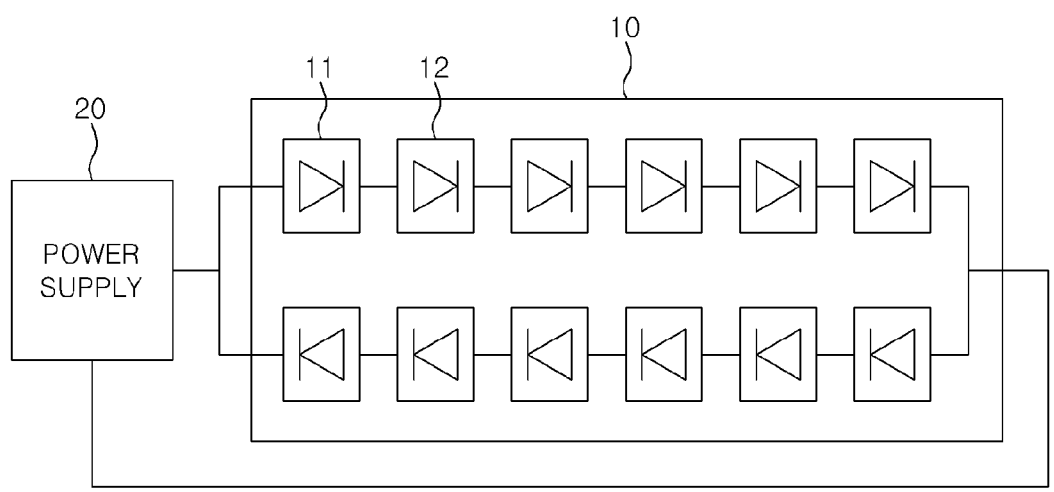
FIG. 1 is a view showing a backlight unit according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 1 is a view showing a backlight unit according to an exemplary embodiment of the present invention.

Referring to FIG. 1, a backlight unit 10 according to the present exemplary embodiment emits light by alternating current (AC) power supplied from a power supply 20.

The backlight unit 10 comprises a plurality of LED packages 11 and 12. The LED packages 11 and 12 are disposed in two or more parallel lines. FIG. 1 shows backlight unit 10 having two parallel lines. The first and second lines are arranged such that their polarities are opposite to each other.

Accordingly, when AC power is applied to the backlight unit 10 from the power supply 20, current flows into the first line in a positive voltage region during a positive phase of AC power so that the LED packages therein emit light, while current flows into the second line in a negative voltage region during a negative phase of AC power so that the LED packages therein emit light.

Therefore, the first and second lines alternately emit light during a complete phase of AC power, which includes one positive phase and one negative phase of AC power. The first line having a positive voltage region should emit light during the positive phase and not emit light during the negative phase, and the second line having a negative voltage region should emit light during the negative phase and not emit light during the positive phase.

The LED packages 11 and 12 are alternately arranged on a surface of the backlight unit 10. The first LED package 11, which emits white light, includes a blue LED chip, a green LED chip, and a first phosphor. Light emitted from the first phosphor is mixed with blue and green lights respectively emitted from the blue and green LED chips to thereby emit white light. Although the first phosphor according to the present exemplary embodiment is a red phosphor, the phosphor according to the present invention is not limited thereto. The second LED package 12, which emits white light, includes a blue LED chip, a red LED chip, and a second phosphor. Light emitted from the second phosphor is mixed with blue and red lights respectively emitted from the blue and red LED chips to thereby emit white light. Although the second phosphor according to the present exemplary embodiment is a green phosphor, the phosphor according to the present invention is not limited thereto. Here, the blue light has a wavelength of 430 to 500 nm, the green light has a wavelength of 500 to 580 nm, and the red light has a wavelength of 580 to 760 nm. The blue light may have a wavelength of 450 to 470 nm, the green light may have a wavelength of 515 to 540 nm, and the red light may have a wavelength of 620 to 640 nm.

Each of the first and second LED packages 11 and 12 includes LED chips on a substrate that are selected from blue, green, and red LED chips that emit light having at least different wavelengths. Each of the first and second LED packages 11 and 12 also include a phosphor that is excited by light emitted from at least one of the LED chips, performs light conversion, and allows light emitted from the phosphor to be mixed with the lights emitted from the LED chips to thereby emit white light.

When AC current having a frequency of 60 Hz is applied to the first and second LED packages 11 and 12 of the backlight unit 10, each of the LED packages 11 and 12 is periodically turned on and emits light.

Figure 2:
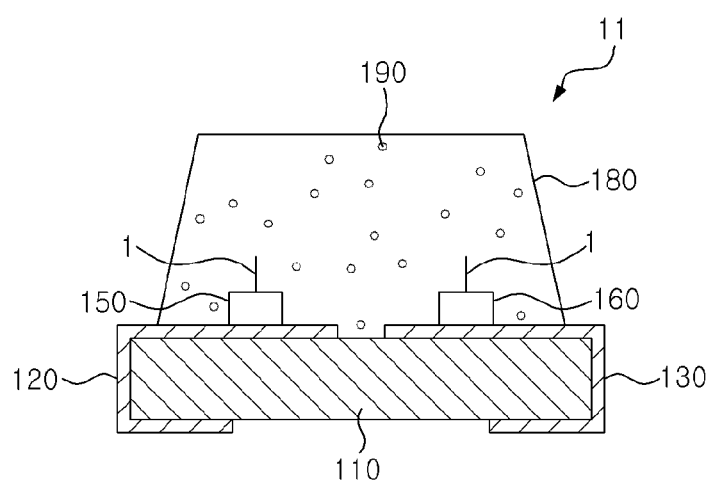
FIG. 2 is a view showing a first LED package according to an exemplary embodiment of the present invention.
Figure 3:
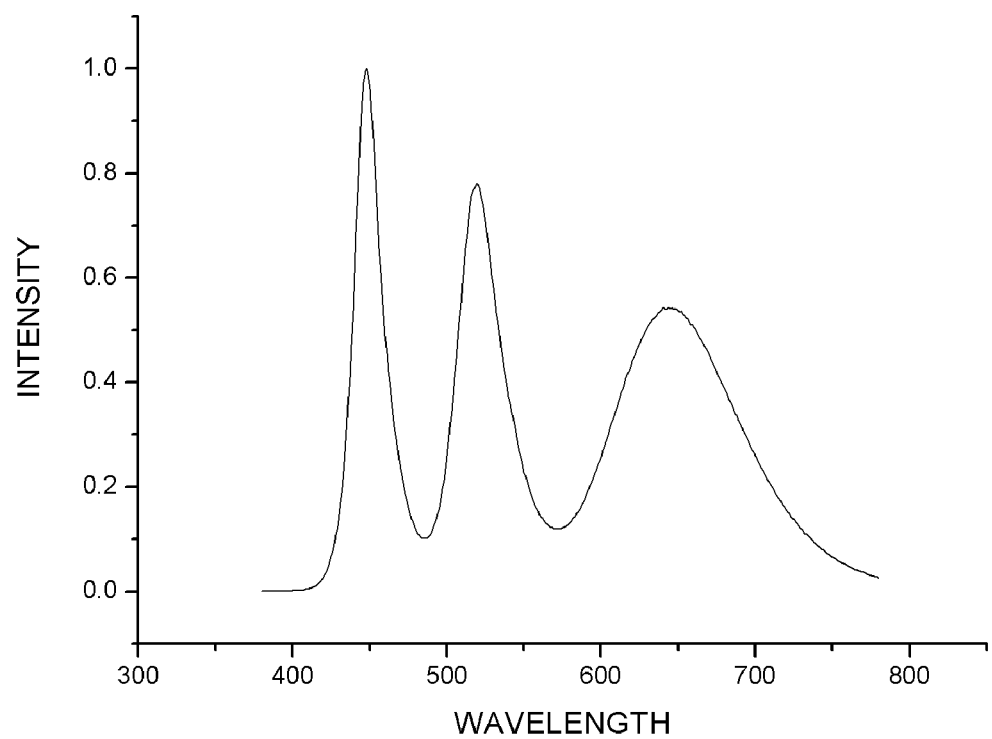
FIG. 3 is a graph showing an optical spectrum of the first LED package shown in FIG. 2.

FIG. 2 is a view showing a first LED package according to an exemplary embodiment of the present invention, and FIG. 3 is a graph showing an optical spectrum of the first LED package shown in FIG. 2.

Referring to FIG. 2, the first LED package 11 includes a substrate 110 and first and second electrodes 120 and 130 formed on the substrate 110. A first LED 150 emitting blue light is mounted on the first electrode 120, and a phosphor 190, which is excited by the blue light and emits red light having a peak wavelength longer than that of the excitation light, is disposed over the first LED 150.

A second LED 160 is mounted on the second electrode 130 and emits green light having a different wavelength from that of the light emitted from the phosphor 190.

The first and second LEDs 150 and 160 may be electrically connected to a third electrode (not shown) through wires 1. However, the present invention is not limited thereto, and various alternate connecting manners are possible.

A molding member 180 for encapsulating the first and second LEDs 150 and 160 is formed on the substrate 110. The phosphor 190 for emitting red light described above is contained in the molding member 180.

The substrate 110 may have a reflective portion (not shown) formed by machining a predetermined recess in a central region of the substrate 110 and allowing a sidewall of the recess to have a predetermined slope.

The first and second LEDs 150 and 160 may be mounted on a bottom surface of the reflective portion, so that the reflection of light emitted from each LED 150 and 160 can be maximized, thereby improving the light emitting efficiency of the LED package 11.

The molding member 180 may be formed through an injection molding process using a mixture of an epoxy or silicon resin and the phosphor 190. Alternatively, the molding member 180 may be formed using a separate mold and then pressurized or heat-treated. The molding member 180 may be formed in various shapes including a convex lens shape, a flat plate shape, a shape having predetermined concavo-convex portions formed on its surface, and the like.

The phosphor 190 contained in the molding member 180 for encapsulating the LEDs 150 and 160 formed on the substrate 110 may include at least one of a silicate-based phosphor, a germanate-based phosphor, and a germanate-silicate-based phosphor.

The phosphor 190 may be uniformly distributed within the molding member 180 as shown in FIG. 2. Accordingly, red light emitted from the phosphor 190 may be mixed with blue and green lights respectively emitted from the first and second LEDs 150 and 160, to thereby emit white light. In order to improve color rendering, a phosphor (not shown) emitting yellow light may be further contained in the molding member 180.

In the first LED package 11 according to the present exemplary embodiment, blue light emitted from the first LED 150 excites the phosphor 190, which then emits light, and the second LED 160 emits light having a different wavelength from the blue light and the light emitted by the phosphor 190, whereby the light emitted from the second LED 160 is mixed with the light emitted by the first LED 150 and the phosphor 190, and the first LED package 11 thereby emits light in a desired spectrum region.

That is, blue and green lights are respectively emitted from the first and second LEDs 150 and 160, and the phosphor 190 is excited by the blue light and emits red light. Accordingly, the emitted lights having three wavelengths are mixed to thereby realize white light.

Figure 4:
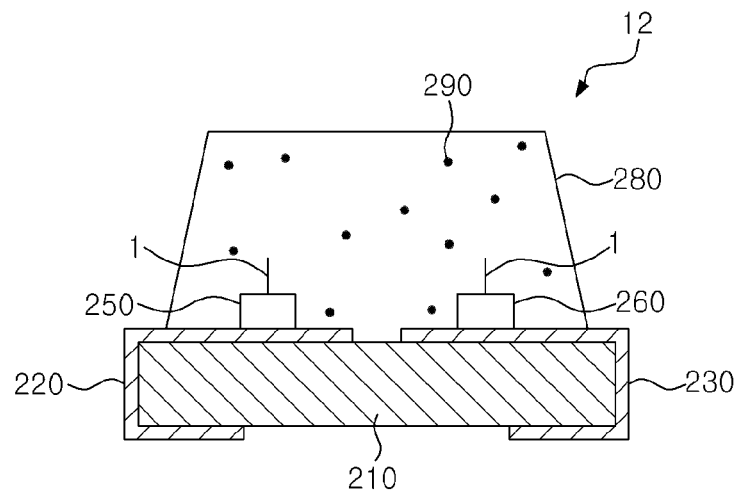
FIG. 4 is a view showing a second LED package according to an exemplary embodiment of the present invention.
Figure 5:
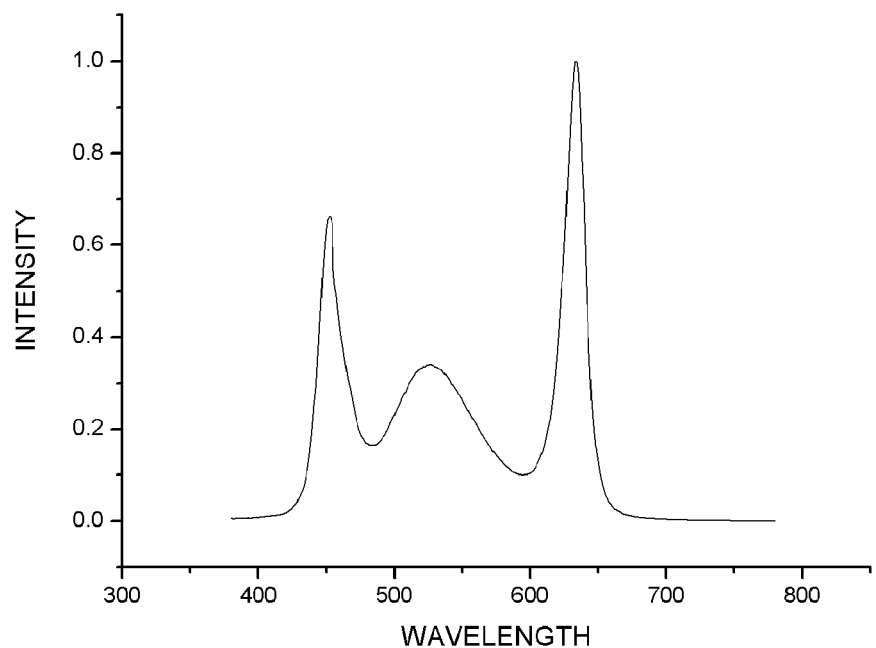
FIG. 5 is a graph showing an optical spectrum of the second LED package shown in FIG. 4.

FIG. 4 is a view showing a second LED package according to an exemplary embodiment of the present invention, and FIG. 5 is a graph showing an optical spectrum of the second LED package shown in FIG. 4.

Referring to FIG. 4, the second LED package 12 includes a substrate 210 and first and second electrodes 220 and 230 formed on the substrate 210. A first LED 250 emitting blue light is mounted on the first electrode 220, and a phosphor 290, which is excited by the blue light and emits green light having a peak wavelength longer than that of the excitation light, is disposed over the first LED 250.

A second LED 260 is mounted on the second electrode 230 and emits red light having a different wavelength from that of the light emitted from the phosphor 290.

The first and second LEDs 250 and 260 may be electrically connected to a third electrode (not shown) through wires 1.

A molding member 280 for encapsulating the first and second LEDs 250 and 260 is formed on the substrate 210. The phosphor 290 for emitting green light described above is contained in the molding member 280.

The substrate 210 may have a reflective portion (not shown) formed by machining a predetermined recess in a central region of the substrate 210 and allowing a sidewall of the recess to have a predetermined slope.

The first and second LEDs 250 and 260 may be mounted on a bottom surface of the reflective portion, so that the reflection of light emitted from each LED 250 and 260 can be maximized, thereby improving the light emitting efficiency of the LED package 11.

The molding member 280 may be formed through an injection molding process using a mixture of an epoxy or silicon resin and the phosphor 290. Alternatively, the molding member 280 may be formed using a separate mold and then pressurized or heat-treated. The molding member 280 may be formed in various shapes including a convex lens shape, a flat plate shape, a shape having predetermined concavo-convex portions formed on its surface, and the like.

The phosphor 290 contained in the molding member 280 for encapsulating the LEDs 250 and 260 formed on the substrate 210 may include at least one of a silicate-based phosphor, a germanate-based phosphor, and a germanate-silicate-based phosphor.

The phosphor 290 may be uniformly distributed within the molding member 280 as shown in FIG. 4. Accordingly, green light emitted from the phosphor 290 may be mixed with blue and red lights respectively emitted from the first and second LEDs 250 and 260, to thereby emit white light. In order to improve color rendering, a phosphor (not shown) emitting yellow light may be further contained in the molding member 280.

In the second LED package 12 according to the present exemplary embodiment, blue light emitted from the first LED 250 excites the phosphor 290, which then emits light, and the second LED 260 emits light having a different wavelength from the blue and the light emitted by the phosphor 290, whereby the light emitted from the second LED 260 is mixed with the light emitted by the first LED 250 and the phosphor 290, and the second LED package 12 thereby emits light in a desired spectrum region.

That is, blue and red lights are respectively emitted from the first and second LEDs 250 and 260, and the phosphor 290 is excited by the blue light and emits green light. Accordingly, the emitted lights having three wavelengths are mixed to thereby realize white light.

Figure 6:
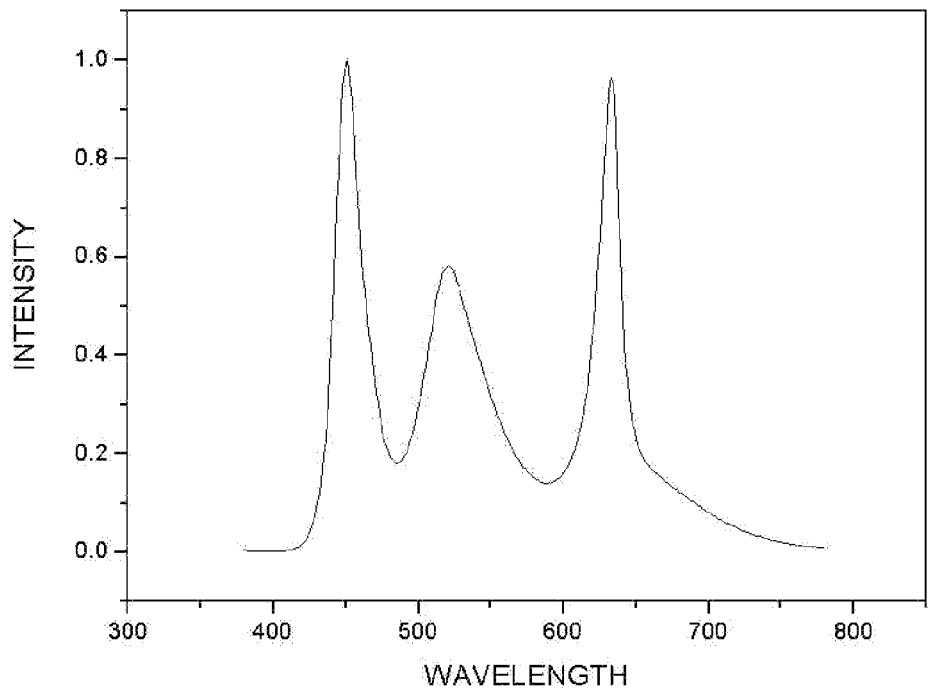
FIG. 6 is a graph showing an optical spectrum of the backlight unit according to an exemplary embodiment of the present invention.

FIG. 6 shows an optical spectrum of the backlight unit having the first and second LED packages 11 and 12 arranged therein according to an exemplary embodiment of the present invention. Referring to FIG. 6, it can be seen that the optical spectra of the first and second LED packages 11 and 12, respectively shown in FIG. 3 and FIG. 5, are combined in the optical spectrum of the backlight unit.

Figure 7:
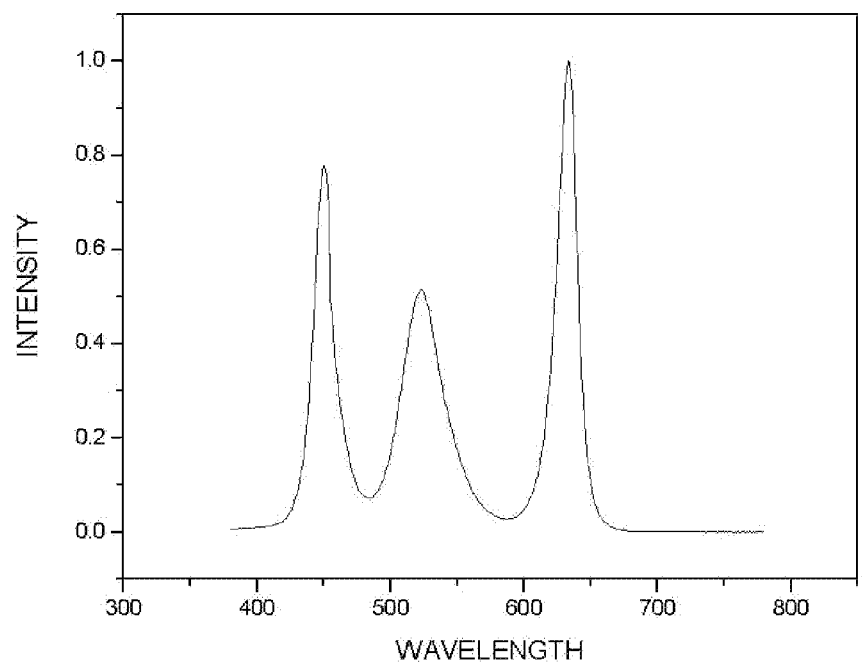
FIG. 7 is a graph showing an optical spectrum of a conventional RGB full-color LED package.
Figure 8:
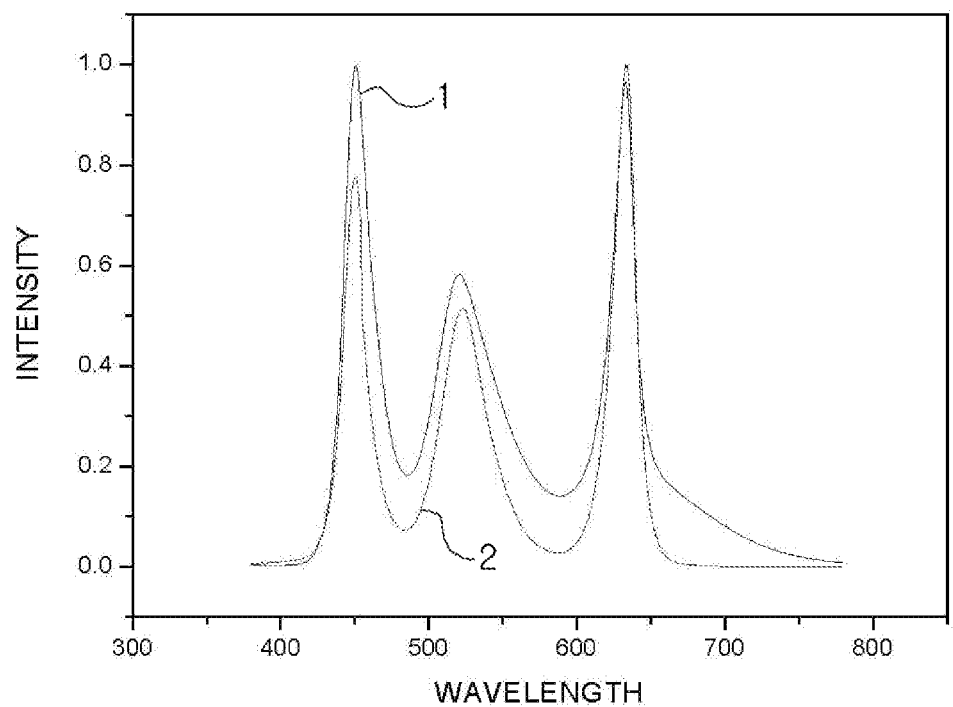
FIG. 8 is a graph showing an optical spectrum of the backlight unit according to an exemplary embodiment of the present invention and an optical spectrum of a backlight unit using the conventional RGB full-color LED package.

FIG. 7 shows an optical spectrum of a conventional RGB full-color LED package, and FIG. 8 shows an optical spectrum 1 of the backlight unit according to an exemplary embodiment of the present invention and an optical spectrum 2 of a backlight unit using the conventional RGB full-color LED package. A color reproduction range of the backlight unit using the conventional RGB full-color LED package is maximally up to 115%. On the other hand, a color reproduction range of the backlight unit according to an exemplary embodiment of the present invention is maximally up to 94%. Accordingly, although the color reproduction range of the backlight unit according to an exemplary embodiment of the present invention may not equal that of the backlight unit using the conventional RGB full-color LED package, the backlight unit according to the present invention can implement a backlight unit having a high color reproduction range and a decreased manufacturing cost compared to the conventional RGB full-color LED package.

According to an exemplary embodiment of the present invention, a backlight unit is implemented by alternately arranging first LED packages, each of which comprises blue and green LED chips and a red phosphor to emit white light, and second LED packages each of which comprises blue and red LED chips and a green phosphor to emit white light, so that the backlight unit can substitute for a conventional backlight unit implemented using an RGB full-color LED package or respective LED chips.

Further, according to an exemplary embodiment of the present invention, the number of LED chips used for the backlight unit is smaller than that used for a conventional backlight unit implemented using an RGB full-color LED package or respective LED chips, so that the probability of defects can be reduced to thereby improve yield and reliability.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A backlight unit, comprising first light emitting diode (LED) packages and second LED packages that are alternately arranged on a surface of the backlight unit, each of the first and second LED packages being disposed on a different region of the surface of the backlight unit,
    wherein each first LED package comprises a blue LED chip, a green LED chip, and a first phosphor, the first phosphor being excited by blue light to emit light to be mixed with blue light and green light respectively emitted from the blue LED chip and the green LED chip, the first LED package to thereby emit white light, and
    wherein each second LED package comprises a blue LED chip, a red LED chip, and a second phosphor, the second phosphor being excited by blue light to emit light to be mixed with blue light and red light respectively emitted from the blue LED chip and the red LED chip, the second LED package to thereby emit white light.

2. The backlight unit of claim 1, wherein the first and second LED packages are disposed in a first line and a second line that is parallel with the first line, and the first line and the second line have opposite polarities.

3. The backlight unit of claim 1, wherein the blue light comprises a wavelength of 430 to 500 nm, the green light comprises a wavelength of 500 to 580 nm, and the red light comprises a wavelength of 580 to 760 nm.

4. The backlight unit of claim 3, wherein the blue light comprises a wavelength of 450 to 470 nm, the green light comprises a wavelength of 515 to 540 nm, and the red light comprises a wavelength of 620 to 640 nm.

5. A backlight unit, comprising:
    a first set of light emitting diode (LED) packages comprising first LED packages and second LED packages that are alternately arranged on a surface of the backlight unit, each of the first and second LED packages being disposed on a different region of the surface of the backlight unit,
    wherein each first LED package comprises a first LED to emit a first light, a second LED to emit a second light, and a first phosphor to emit a third light in response to the first light, the first light, the second light, and the third light being different colored lights that mix together to form white light, and
    wherein each second LED package comprises a third LED to emit a fourth light, a fourth LED to emit a fifth light, and a second phosphor to emit a sixth light in response to the fourth light, the fourth light, and the fifth light, and the sixth light being different colored lights that mix together to form white light.

6. The backlight unit of claim 5, further comprising:
a second set of LED packages comprising first LED packages and second LED packages that are alternately arranged on the surface of the backlight unit, each of the first and second LED packages being disposed on a different region of the surface of the backlight unit; and
a power source,
wherein the first set of LED packages emit light in response to a first phase of the power source, and the second set of LED packages emit light in response to a second phase of the power source.

7. The backlight unit of claim 6, wherein the first light is a blue light, the second light is green light, and the third light is a red light,
wherein the fourth light is a blue light, and the fifth light is a red light, and the sixth light is a green light.

8. The backlight unit of claim 7, wherein the first set of LED packages is arranged in a first line, and the second set of LED packages is arranged in a second line that is parallel with the first line.

9. The backlight unit of claim 5, wherein each first LED package further comprises a first molding member encapsulating the first LED and the second LED, the first phosphor being contained within the first molding member.

10. The backlight unit of claim 9, wherein each second LED package further comprises a second molding member encapsulating the third LED and the fourth LED, the second phosphor being contained within the second molding member.

11. A backlight unit, comprising first light emitting diode (LED) packages and second LED packages alternately arranged on a surface of the backlight unit, each of the first and second LED packages being disposed on a different region of the surface of the backlight unit,
wherein each first LED package comprises a blue LED chip, a green LED chip, and a first phosphor, the first phosphor being excited by blue light to emit light to be mixed with blue light and green light respectively emitted from the blue LED chip and the green LED chip, the first LED package to thereby emit white light,
wherein each second LED package comprises a blue LED chip, a red LED chip, and a second phosphor, the second phosphor being excited by blue light to emit light to be mixed with blue light and red light respectively emitted from the blue LED chip and the red LED chip, the second LED package to thereby emit white light, and
wherein the first and second LED packages each comprise an electrode contacting the surface of the backlight unit.

12. The backlight of claim 11, wherein the first and second LED packages each further comprises a package body.

13. The backlight of claim 12, wherein each package body is spaced apart from the surface of the backlight unit.

14. The backlight of claim 11, wherein each of the electrodes is arranged on a first side of the package body and a second side of the package body opposite to the first side.

* * * * *